United States Patent [19]

Sasaki

[11] Patent Number: 4,527,181
[45] Date of Patent: Jul. 2, 1985

[54] HIGH DENSITY SEMICONDUCTOR MEMORY ARRAY AND METHOD OF MAKING SAME

[75] Inventor: Nobuo Sasaki, Kawasaki, Japan

[73] Assignee: Fujitsu Limited, Kawasaki, Japan

[21] Appl. No.: 295,585

[22] Filed: Aug. 24, 1981

[30] Foreign Application Priority Data

Aug. 28, 1980 [JP] Japan .................................. 55-117824

[51] Int. Cl.³ ...................... H01L 29/78; H01L 27/02; H01L 27/12; H01L 29/06
[52] U.S. Cl. ................................. 357/23.7; 357/23.1; 357/23.9; 357/41; 357/49; 357/55; 365/176; 365/182
[58] Field of Search ............... 357/23 TF, 23 R, 23 S, 357/41, 49, 55, 56; 365/176, 182

[56] References Cited

U.S. PATENT DOCUMENTS

| | | | |
|---|---|---|---|
| 4,236,167 | 11/1980 | Woods | 357/23 TF |
| 4,250,569 | 2/1981 | Sasaki | 357/23 TF |
| 4,297,719 | 10/1981 | Hsu | 357/23 TF |
| 4,317,686 | 3/1982 | Anand et al. | 357/49 |

FOREIGN PATENT DOCUMENTS 55-71069 5/1980 Japan ................ 357/23 TF

OTHER PUBLICATIONS

P. J. Krick, "MNOS Memory Array Fabricated on an Insulating Substrate", *IBM Technical Disclosure Bulletin*, vol. 15 (1972) pp. 466–467.

G. V. Clarke and J. E. Tomko, "Capacitor for Single FET Memory Cell", *IBM Technical Disclosure Bulletin*, vol. 17 (1975) pp. 2579–2580.

*Primary Examiner*—Andrew J. James
*Assistant Examiner*—J. Carroll
*Attorney, Agent, or Firm*—Staas & Halsey

[57] ABSTRACT

A semiconductor device according to the present invention including a first semiconductor region formed on an insulating substrate which is a bit line and, another or second semiconductor region formed on the substrate which is a power supply line. The semiconductor device also includes an opposite conductive type semiconductor region formed on the substrate which is between the two semiconductor regions, additionally includes a metal wiring layer which is a word line and which is situated on an insulating layer on the opposite conductive type semiconductor region. The first semiconductor region bit line is in parallel with the second semiconductor region powerline which is connected to an electric power supply. The metal wiring word line being perpendicular to the second semiconductor region power line which is connected to the electric power supply.

7 Claims, 12 Drawing Figures

HIGH DENSITY SEMICONDUCTOR MEMORY ARRAY AND METHOD OF MAKING SAME

BACKGROUND OF THE INVENTION

The present invention relates to a high density semiconductor device, in particular a semiconductor device comprising charge-pump-memory cells and a process for producing the same.

The term charge-pump-memory cell used herein designates a kind of semiconductor memory cells, wherein a semiconductor region under a gate of a MOS transistor is in a floating state and information is stored in the MOS transistor as a potential variation of the floating region. The information is read out of the charge-pump-memory cell as a change in drain current due to a substrate bias effect.

Conventionally, a silicon gate MOS transistor has been used in the charge-pump-memory cell and a polycrystalline silicon layer and an aluminum layer have been used as a word line and a bit line, respectively. A cross sectional view of an embodiment of the conventional charge-pump-memory cell is shown in FIG. 1.

Referring to FIG. 1, a silicon dioxide layer 4 is situated on a sapphire substrate 1, p type silicon epitaxial region 3 is also situated on the sapphire 1 and it is in an electrically floating state thus, the p type silicon epitaxial region is called a floating substrate. On the silicon dioxide layer 4, a phosphosilicate-glass layer 5 is formed, while covering a polycrystalline silicon layer 6 forming a word line. The silicon dioxide layer 4 and the phosphosilicate-glass layer 5 are provided with a contact hole exposing the surface of the n+ type silicon epitaxial region 2. Aluminum wiring 7 is provided on the phosphosilicate glass layer 5 and in the contact hole 8 to make contact with the n+ type silicon epitaxial layer 2.

In the conventional charge-pump-memory device having such a contact hole, it is necessary to provide a certain distance between the contact hole 8 and the polycrystalline silicon layer 6, because there is a possibility that the polycrystalline silicon layer 6 and the aluminum wiring 7 will come in contact with each other. Providing the certain distance between the contact hole 8 and the polycrystalline silicon layer 6 deteriorates the packing density which is an important property of the memory device. Furthermore, when the contact hole is formed in the conventional charge-pump-memory cell, it is necessary to exactly align the position of the contact hole 8 with the position of the n+ type epitaxial layer 2 and the position of aluminum wiring 7. Additionally, the structure of the conventional memory device is very complicated, i.e. the device consists of three layers, an epitaxial single-silicon layer, a polycrystalline silicon layer and an aluminum wiring layer and further comprises the above-mentioned contact hole. Thus the process for producing the charge pump memory cell is also complicated.

SUMMARY OF THE INVENTION

Accordingly, it is an object of the present invention to provide a semiconductor device comprising charge-pump-memory cells, which has a high packing density and a simple structure, and to provide a simple process for producing the same.

According to the present invention, the foregoing object is attained by a semiconductor device and a process for producing the same, which device comprises a first semiconductor region formed on an insulating substrate which comprises a bit line, another or second semiconductor region formed on the substrate which is connected to a power supply, an opposite conductive type semiconductor region formed on the substrate between the above two semiconductor regions, and metal wiring comprising a word line which is situated on an insulating layer on the opposite conductive type semiconductor region. The first semiconductor region comprising a bit line being parallel with the second semiconductor region which is connected to a power supply, and said metal wiring comprising the word line being perpendicular to the second semiconductor region which is connected to the power supply.

BRIEF DESCRIPTION OF THE DRAWINGS

FIGS. 3f' and 3h' are parts of plan views of FIGS. 3f and 3h, respectively.

DESCRIPTION OF THE PREFERRED EMBODIMENT

Figure 2:
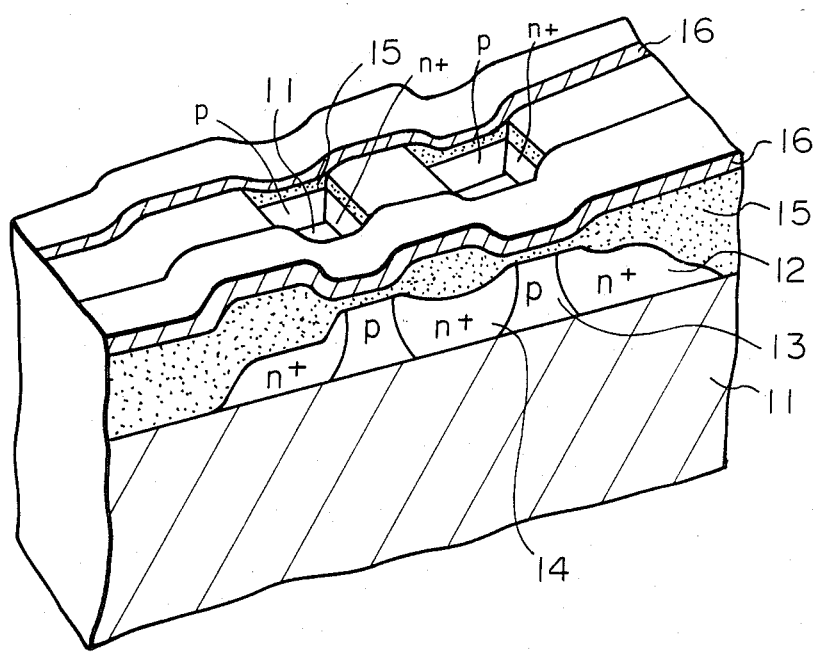
FIG. 2 is diagram illustrating a perspective view including a cross sectional view of a main portion of a semiconductor device according to the present invention.

With reference to FIG. 2, an n+ type silicon region 12 comprising a bit line, a p type silicon region 13 an n+ type silicon region 14 which is connected to a power supply are situated on a sapphire substrate 11. Three regions, namely the n+ type silicon regions 12 and 14 and the p type silicon region 13 form a semiconductor region which comprises a memory cell. A silicon dioxide layer 15 is formed as a gate insulating layer on the semiconductor region 13. The silicon dioxide layer 15 on the n+ type silicon regions 12 and 14 is thick. Aluminum wiring 16 which comprises a word line is formed in the shape of a stripe on a silicon dioxide layer 15. The n+ type silicon region 12 which comprises the above-mentioned bit line is situated parallel with the n+ type silicon region 14 which comprises a power supply line and further, the aluminum wiring 16 is situated perpendicular to the n+ type silicon region 14. Furthermore, the p type silicon region 13 is self-aligned to the aluminum wiring layer 16 and to n+ type silicon regions 12 and 14. A thin oxide on the area situated between the aluminum wiring 16 and between the n+ type silicon regions 12 and 14 having a thick oxide is removed, and the p-type silicon at the area is also etched off. No photo-mask is required for these process steps because the aluminum wiring 16 and the thick oxide on the regions 12 and 14 are used as etching masks. According to the present invention, the semiconductor device comprising such a charge-pump-memory cell has such advantages that the contact hole which is required in the prior art is avoided, size reduction of the memory cell can be achieved and a exact alignment of a metal wiring to a p type silicon region is not required. Additionally the polycrystalline semiconductor layer is avoided since the metal wiring is used as a word line. Thus, the structure of the charge-pump-memory is simplified and the photo-mask patterns necessary to form the power supply lines, the bit lines and word lines are very simple; i.e. they are stripes in parallel.

The metal wiring layer, which is also used as a gate electrode, is preferably aluminum or molybdenum or tungsten or silicide.

The sapphire substrate may be replaced by semi-insulating gallium-arsenide or spinel or silicon-dioxide.

An example of a process for producing a semiconductor device according to the present invention will now be explained with reference to FIG. 3a to FIG. 3h.

Figure 3A:
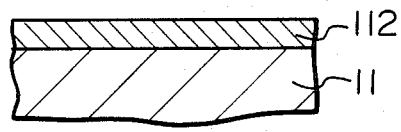
FIGS. 3a to 3h are diagrams illustrating cross sectional views showing an example of a process according to the present invention.
Figure 3B:
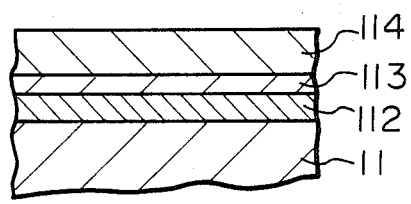

With reference to FIG. 3a, on an insulating sapphire substrate 11 a single-silicon layer 112 having a thickness of 0.6 μm is formed by an epitaxial growth technique. Then the single-silicon layer 112 is oxidized at a temperature of about 900° C. and a silicon dioxide layer 113 having a thickness of 500 Å is obtained. Then, on the silicon dioxide layer 113 a silicon nitride layer 114 having a thickness of 1500 Å is deposited by using a chemical vapour deposition process (FIG. 3b).

Figure 3C:
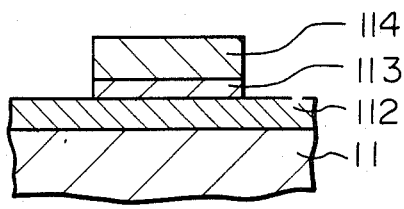

Then, a photo-resist layer is coated on the silicon nitride layer 114 and the resist layer having a thickness of 9000 Å is formed, and then the silicon dioxide layer 113 and the silicon nitride 114 are patterned by using a plasma etching process (FIG. 3C).

Figure 3D:
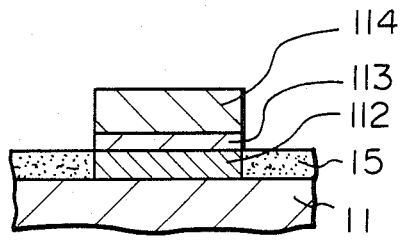
Figure 3E:
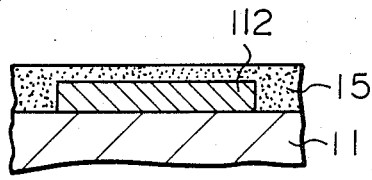

Then, half of the single-silicon layer 112 having a thickness of 0.6μ, which is not situated at a position under the silicon nitride 114 is removed by using the plasma etching process and the remaining single-silicon layer having a thickness of 0.3μ is oxidized in steam at a temperature of 950° C. by using the Local Oxidation of Silicon technique (FIG. 3d).

Then, the silicon dioxide layer 113 and the silicon nitride layer 114 which are situated on a single-silicon layer are removed by using an etching process and then a silicon dioxide layer 15 is formed on the single-silicon layer 112 by the oxidation process so that the thickness of the silicon dioxide layer over the single-silicon layer 112 becomes 500 Å and $0.6\mu \pm 600$ Å over the substrate 11. Then boron ions are implanted into the single-silicon layer to $4 \times 10^{12}$ cm$^{-2}$ so that the single-silicon layer 112 is changed to a p type, and a silicon nitride layer 114' is formed on the silicon dioxide layer 15 by using the chemical vapour deposition process, after that, the silicon nitride layer is patterned by a photo-etching process (FIG. 3f).

Arsenic ions are implanted into the p type single-silicon region to $1 \times 10^{15}$ cm$^{-2}$ by using the defined silicon nitride 114' as a mask so that n+ type regions are formed in the p type single-silicon region. In this case the n+ type silicon region does not generally reach the sapphire substrate 11. Then a thick oxide is grown by a thermal oxidation process using the silicon nitride pattern 114' as a mask, and at this time the n+ type silicon region reaches the sapphire substrate 11, after that, the silicon nitride layer is removed by the etching process (FIG. 3g).

Figure 3F:
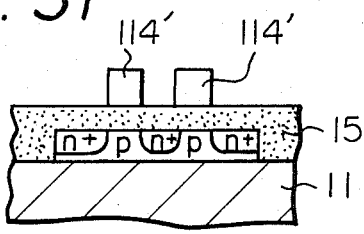
Figure 3F:
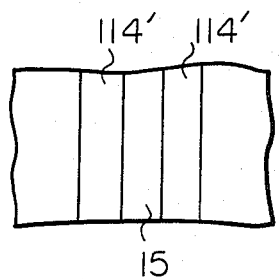
Figure 3G:
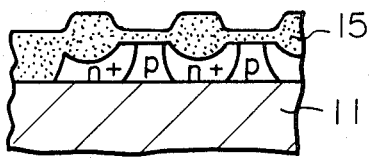
Figure 3H:
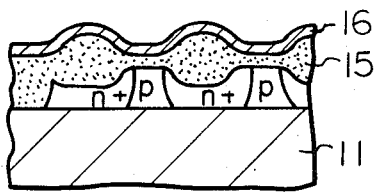
Figure 3H:
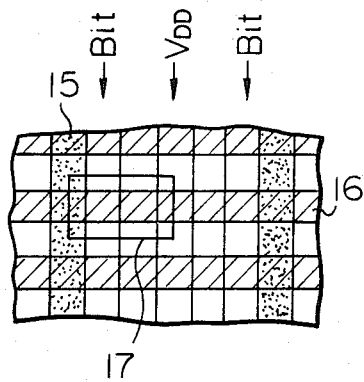

Then, aluminum is evaporated onto the surface defined in a shape of a stripe, and then the thin silicon dioxide layer is removed by the plasma etching process using the aluminum as a mask, and the single-silicon layer under the thin silicon dioxide layer is also etched off (FIG. 3h). Then phosphosilicate glass is deposited (similar to 5 in FIG. 1) and standard bonding pad windows are opened using standard process step. In this case the single-silicon layer is arranged under the aluminum layer.

FIG. 3f' illustrates a plan view of FIG. 3f and FIG. 3h' illustrates a plan view of FIG. 3h. In FIG. 3h' a bit line, and a power supply $V_{DD}$ line is illustrated and the reference numeral 17 illustrates a cell area. According to the present invention, if each width and space of the bit line, $V_{DD}$ line and aluminum word line is F, the cell area 17 becomes 6F$^2$. If the length of F is 2 μm the cell area is 24 μm$^2$. This value for the cell area is smaller than that of the prior art, therefore, the packing density is improved.

Figure 1:
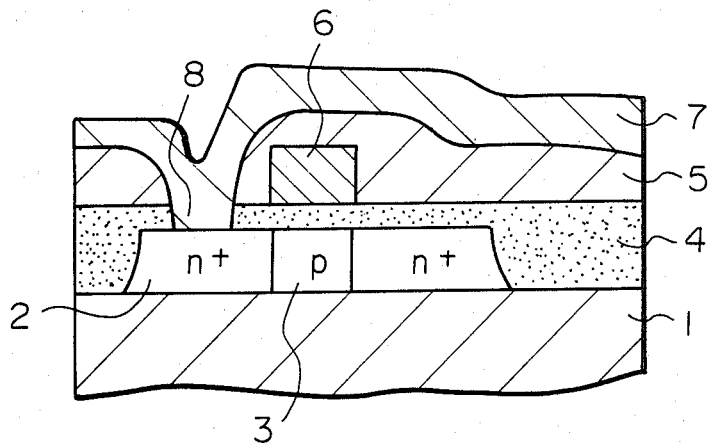
FIG. 1 diagram illustrating a main portion of a cross sectional view of a conventional semiconductor device.

Additionally, according to the present invention the structure of the device is simple as understood from the comparison between FIG. 1 illustrating the conventional device and FIG. 2 illustrating the present invention. Namely the contact hole is not required and the polycrystalline silicon layer is avoided.

I claim:

1. A semiconductor device, comprising:
   an insulating substrate;
   a first semiconductor region of a first conductive type formed on said insulating substrate and comprising a conductive bit line;
   A second semiconductor region of the first conductive type formed on said insulating substrate and operatively connected to a power supply;
   a third semiconductor region of a second and opposite conductive type formed on said insulating substrate and situated between said first and second semiconductor regions;
   an insulating layer formed on said first, second and third semiconductor regions, said insulating layer having first and second thicknesses, said second thickness being thinner than said first thickness, said first thickness being associated with said first and second semiconductor regions, and said second thickness being associated with said third semiconductor region; and
   metal wiring comprising a word line formed on said insulating layer, said first and second semiconductor regions being aligned in parallel with each other, said metal wiring being aligned perpendicular to the direction in which said first and second semiconductor regions are aligned and said third semiconductor region being positioned directly under only said metal wiring, thereby providing self-aligned holes adjacent laterally to said third semiconductor region in a direction perpendicular to said metal wiring.

2. A semiconductor device according to claim 1, wherein said insulating substrate is selected from the group consisting of sapphire, gallium-arsenide, spinel and silicon-dioxide.

3. A semiconductor device according to claim 1 or 2, wherein said metal wiring is selected from the group consisting of aluminum, molybdenum, tungsten and silicide.

4. A semiconductor device according to claim 1, further comprising:
   a fourth semiconductor region of the second conductive type formed on said insulating substrate and adjacent to said second semiconductor region; and
   a fifth semiconductor region of the first conductive type formed on said insulating substrate and adjacent to said fourth semiconductor region and comprising a conductive bit line, said fifth semiconductor region being aligned parallel with said first and second semiconductor regions, and said fourth semiconductor region being aligned under said metal wiring, said first, second and third semiconductor regions forming a first charge pumped memory cell and said second, fourth and fifth semiconductor regions forming a second charge pumped memory cell.

5. A semiconductor device according to claim 1, wherein said first thickness is approximately 0.6μ and said second thickness is approximately 500 Å.

6. A semiconductor device according to claim 1, wherein said insulating layer comprises only silicon dioxide.

7. A semiconductor device according to claim 1, wherein said first and second semiconductor regions are continuous and said third semiconductor region is discontinuous due to the self-aligned holes.

* * * * *

UNITED STATES PATENT AND TRADEMARK OFFICE
CERTIFICATE OF CORRECTION

PATENT NO. : 4,527,181
DATED : July 2, 1985
INVENTOR(S) : NOBUO SASAKI

It is certified that error appears in the above-identified patent and that said Letters Patent is hereby corrected as shown below:

Col. 1, line 19, "cell" should be --cell;--;

Col. 2, line 17, after "1" insert --is a--;
        line 19, after "is" insert --a--;
        line 32, after "13" insert --and--;
        line 61, delete "a" (both occurrences);

Col. 3, line 24, "$\mu$" should be --$\mu$m--;
        line 27, "$\mu$" should be --$\mu$m--;
        line 36, "$\mu$" should be --$\mu$m--;
        line 62, "step" should be --steps--.

Col. 4, line 19, "A" should be --a--.

Signed and Sealed this

Third Day of December 1985

[SEAL]

Attest:

DONALD J. QUIGG

Attesting Officer     Commissioner of Patents and Trademarks